United States Patent [19]

Shimada et al.

[11] Patent Number: 5,343,183

[45] Date of Patent: Aug. 30, 1994

[54] MAGNETIC FIELD CORRECTION DEVICE

[75] Inventors: Uji Shimada; Tatuya Oue, both of Ako, Japan

[73] Assignee: Mitsubishi Denki Kabushiki Kaisha, Tokyo, Japan

[21] Appl. No.: 54,827

[22] Filed: Apr. 30, 1993

Related U.S. Application Data

[63] Continuation of Ser. No. 789,891, Nov. 12, 1991.

[30] Foreign Application Priority Data

Nov. 9, 1990 [JP] Japan .................. 2-302782

[51] Int. Cl.$^5$ .................. G01V 3/00; G01R 33/20
[52] U.S. Cl. .................. 335/301; 324/319
[58] Field of Search ........ 335/211, 212, 214, 296–306; 324/318, 319, 320

[56] References Cited

U.S. PATENT DOCUMENTS

| | | | |
|---|---|---|---|
| 4,639,673 | 1/1987 | Zijlstra | 324/319 |
| 4,698,611 | 10/1987 | Vermilyea | |
| 4,743,853 | 5/1988 | Frese | |
| 4,748,413 | 5/1988 | Frese | 324/318 |
| 4,758,813 | 7/1988 | Holsinger et al. | 335/306 |
| 4,803,433 | 2/1989 | McBride | 324/318 |
| 4,853,663 | 8/1989 | Vermilyea | 335/301 |
| 5,045,794 | 9/1991 | Dorri | 324/320 |
| 5,047,720 | 9/1991 | Guy | 324/320 |
| 5,168,231 | 12/1992 | Aubert | 324/320 |

FOREIGN PATENT DOCUMENTS

| | | |
|---|---|---|
| 4021345 | 1/1991 | Fed. Rep. of Germany . |
| 177506 | of 1988 | Japan . |
| 2235777A | 3/1991 | United Kingdom . |
| 8808126 | 10/1988 | World Int. Prop. O. . |

OTHER PUBLICATIONS

John H. Coupland, "Shimming Solenoidal Magnets", Rutherford Appleton Laboratory, Chilton, Oxfordshire, United Kingdom; pp. 174–179, 1987.
German Search Report, Feb. 2, 1993.

*Primary Examiner*—Leo P. Picard
*Assistant Examiner*—Raymond Barrera
*Attorney, Agent, or Firm*—Sughrue, Mion, Zinn, Macpeak & Seas

[57] ABSTRACT

A magnetic field correction device for producing a uniform field within a coil includes non-magnetic tubes attached on a cylinder at specific circumferential angles $\psi$ to accommodate the non-magnetic tubes therein. Each of the magnetic shims consists of two rod members of predetermined lengths and transverse sectional area ratio. The end angles and the sectional area ratio $A_2/A_1$ of the two rods satisfy specific relationships.

3 Claims, 4 Drawing Sheets

MAGNETIC FIELD CORRECTION DEVICE

This is a continuation of application No. 07/789,891 filed on Nov. 12, 1991.

BACKGROUND OF THE INVENTION

This invention relates to magnetic field correction devices utilized, for example, in electromagnets for generating a uniform field for nuclear magnetic resonance.

FIG. 8 is a schematic perspective view of a conventional magnetic field correction device, which is disclosed, for example, in Japanese Laid-Open Patent (Kokai) No. 52-193230. Within a coil 3 is disposed an interior cylinder 10 made of a non-magnetic material, on which rod-shaped magnetic members 2 are adhered. The magnetic field generated by the coil 3 is not sufficiently uniform as required within the uniform field region 4. Thus, the magnetic members 2 are attached on the interior cylinder 10 to modify the spatial distribution of the magnetic filed and to enhance the uniformity of the magnetic field within the uniform field region 4.

In the case of the conventional device, the magnetic members 2 are attached to arbitrarily selected positions on the interior cylinder 10 and the variation of the magnetic field distribution within the uniform field region 4 is determined experimentally. An arrangement of magnetic members 2 is selected by those skilled in the art on the basis of their experience so as to achieve the required uniformity within the uniform field region 4.

The above conventional magnetic field correction device thus has the following disadvantage. The dimensions, number, and positions of the magnetic members 2 are determined, for the main part, by the experience of the assembling engineer. There are no fast and definite rules for determining the dimensions, number, and positions of the magnetic members 2. Thus, the arrangements of the magnetic members 2 are not necessarily optimized, and the qualities of the magnetic field vary from one device to another. Further, the magnetic members 2 are sometimes attached to positions outside of the region on which the designer of the magnetic field correction device intends to mount the magnetic members 2 for the purpose of avoiding interferences with other parts of the device.

SUMMARY OF THE INVENTION

It is therefore an object of this invention to provide a magnetic field correction device by which the magnetic members can be easily mounted at axial and circumferential positions according to the intention of the designer of the field correction device.

The above object is accomplished in accordance with the principle of this invention by a magnetic field correction device which comprises: a plurality of non-magnetic tubes disposed on a cylinder of a predetermined radius disposed coaxially with said coil, said non-magnetic tubes each extending along a direction of axis of said coil and disposed at predetermined angles along a circumference of said cylinder; and a plurality of rod-shaped magnetic members removably inserted into said non-magnetic tubes, said magnetic members each consisting of two rod-shaped components of predetermined lengths and predetermined transverse sectional area ratio, such that said magnetic members form predetermined end angles when inserted into respective non-magnetic tubes.

For the purpose of eliminating the first order errors, it is preferred that said non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ to accommodate respective magnetic members thereat; when said magnetic members are inserted into respective non-magnetic tubes, a sum of two end angles of each of the two rod-shaped components of said magnetic members with respect to an origin at a center of a uniform field region are equal to $\pi$; and when said magnetic members are inserted into respective non-magnetic tubes, transverse cross sectional areas $A_1$ and $A_2$ of the two rod-shaped components of said magnetic members satisfy:

$$(A_2/A_1) = P^1_4(\cos\alpha_1)\sin^5\alpha_1/P^1_4(\cos\alpha_2)\sin^5\alpha_2,$$

wherein: $P^1_4$ is an associated Legendre polynomial; and $\alpha_1$ and $\alpha_2$ are two distinct angles such that $g(\alpha_1)=g(\alpha_2)$, where $g(\alpha)=P^1_6(\cos\alpha)\sin^2\alpha/P^1_4(\cos\alpha)$, $P^1_6$ and $P^1_4$ being associated Legendre polynomials.

For the purpose of eliminating the second order errors relative to ZX and ZY, it is preferred that said non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ to accommodate respective magnetic members thereat; when said magnetic members are inserted into respective non-magnetic tubes, outer end angles $\alpha\text{I}$ of the two-rod shaped components of said magnetic members with respect to an origin at a center of a uniform field region are equal to each other; and when said magnetic members are inserted into respective non-magnetic tubes, transverse cross sectional areas $A_1$ and $A_2$ and inner end angles $\alpha_1$ and $\alpha_2$, with respect to said origin, of the two rod-shaped components of said magnetic members satisfy:

$$(A_2/A_1) = -P^1_5(\cos\alpha_1)\sin^6\alpha_1/P^1_5(\cos\alpha_2)\sin^6\alpha_2,$$

wherein: $P^1_5$ is an associated Legendre polynomial; and $\alpha_1$ and $\alpha_2$ are two distinct angles such that $g(\alpha_1)=-g(\alpha_2)=g(\alpha\text{II})$, where $g(\alpha)=P^1_7(\cos\alpha)\sin^2\alpha/P^1_5(\cos\alpha)$, and $P^1_5$ being associated Legendre polynomials.

For the purpose of eliminating the second order errors relative to XY and $X^2$-$Y^2$, it is preferred that said non-magnetic tubes are disposed at circumferential angles $(\pi/2)(\pm 1/1 \pm\frac{1}{3}\pm\frac{1}{4})+(\frac{1}{2})\pi$, $(\pi/2)(\pm 1/1 \pm\frac{1}{3}\pm\frac{1}{4})+(\frac{3}{2})\pi$, $(\pi/2(\pm 1/1 \pm\frac{1}{3}\pm\frac{1}{4})$, or $(\pi/2)(\pm 1/1 \pm\frac{1}{3}\pm\frac{1}{4})+(\frac{1}{2})\pi$ to accommodate respective magnetic members thereat; when said magnetic members are inserted into respective non-magnetic tubes, a sum of two end angles of each of the two rod-shaped components of said magnetic members with respect to an origin at a center of a uniform field region are equal to $\pi$; and when said magnetic members are inserted into respective non-magnetic tubes, transverse cross-sectional areas $A_1$ and $A_2$ and inner end angles $\alpha_1$ and $\alpha_2$, with respect to said origin, of the two rod-shaped components of said magnetic members satisfy:

$$(A_2/A_1) = -P^2_5(\cos\alpha_1)\sin^6\alpha_1/P^2_5(\cos\alpha_2)\sin^6\alpha_2,$$

wherein: $P^2_5$ is an associated Legendre polynomial; and $\alpha_1$ and $\alpha_2$ are two distinct angles such that $g(\alpha_1)=g(\alpha_2)$, where $g(\alpha)=P^2_7(\cos\alpha)\sin^2\alpha/P^2_5(\cos\alpha)$, $P^2_7$ and $P^2_5$ being associated Legendre polynomials.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
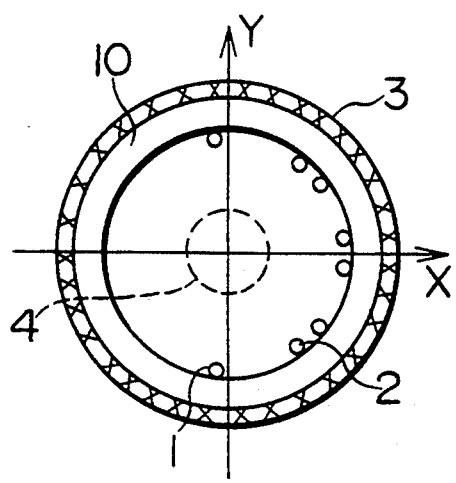
FIG. 1 shows a transverse sectional view of an electromagnet device provided with a magnetic field correction device according to this invention.
Figure 2:
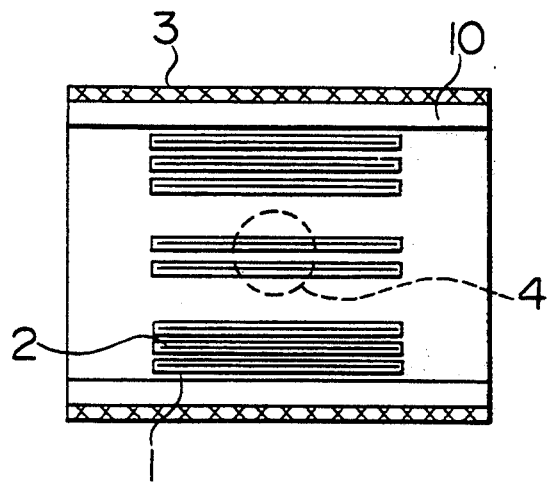
FIG. 2 shows a longitudinal sectional view of the device of FIG. 1.

FIG. 1 shows a transverse sectional view of an electromagnet device provided with a magnetic field correction device according to this invention, and FIG. 2 shows a longitudinal sectional view of the device of FIG. 1.

An interior cylinder 10 is coaxially inserted within a cylinder-shaped coil 3 which generates the main magnetic field therewithin. A plurality of non-magnetic tubes 1 made of a non-magnetic material are attached on the interior surface of the interior cylinder 10, such that the magnetic members 2 can be selectively inserted into and removed from respective non-magnetic tubes 1. For simplicity, FIGS. 1 and 2 show only the non-magnetic tubes 1 and the magnetic members 2 for correcting the positive linear X-component error field. As described below, the field within a uniform field region 4 is rendered homogeneous by means of the fields generated by the magnetic members 2.

Figure 3:
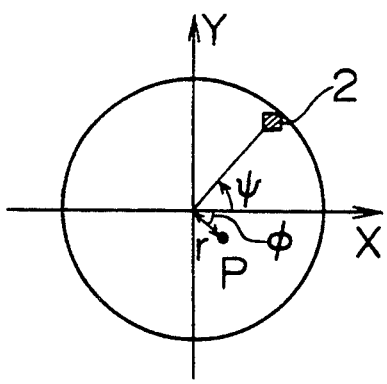
FIG. 3 is a diagrammatic transverse section view showing circumferential position of a magnetic shim (magnetic member)
Figure 4:
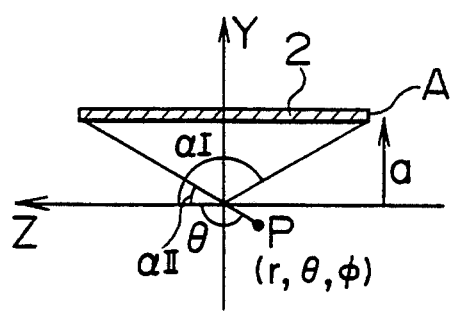
FIG. 4 is a diagrammatic longitudinal sectional view of a magnetic shim (magnetic member)

According to this invention, parameters (the number, circumferential and axial positions, the transverse sectional areas, etc) of the magnetic members 2 are determined in accordance with this invention to satisfy definite predetermined relationships. FIG. 3 is a diagrammatic transverse section view showing the circumferential position of a magnetic shim (magnetic member), and FIG. 4 is a diagrammatic longitudinal sectional view of a magnetic shim (magnetic member). In FIGS. 3 and 4, a rod-shaped magnetic shim 2 having a transverse area A is positioned at a radius a from the Z-axis and at an angle $\psi$ with respect to the X-axis. The two ends of the magnetic shim 2 forms a larger angle $\alpha I$ (referred to as the "outer end angle") and a smaller angle $\alpha II$ (referred to as the "inner end angle") with the Z-axis, which coincides with the central axis of the coil 3. The X-Y plane intersects the coil 3 at the middle, such that the origin (0, 0, 0) coincides with the center of the uniform field region 4. The position of an arbitrary point P within the uniform field region 4 is represented by the polar coordinates $(r, \theta, \phi)$.

Thus, the Z-component $B_z$ of the magnetic field generated by a magnetic shim 2 at point P is represented by:

$$Bz = -K \cdot (1/a^2) \cdot A_n \cdot \qquad (1)$$

$$\sum_{n=0}^{\infty} \sum_{m=0}^{\infty} \epsilon_m \frac{(n-m+1)!}{(n+m)!} [P_{n+1}^m(\cos\alpha) \sin^{n+2}\alpha]_{\alpha I}^{\alpha II} \cdot$$

$$(r/a)^n \cdot P_n^m (\cos\theta) \cdot \cos m(\phi - \psi)$$

wherein

K is a constant determined by the magnetic characteristics of the magnetic shim;

$\epsilon_m$ is the Neumann coefficient, which is equal to 1 ($\epsilon_m = 1$) where m=0, and equal to 2 ($\epsilon_m = 2$) otherwise; and $P_n^m$ represents the associated Legendre polynomial of degree n and order m.

The correspondence between the terms in polar coordinates expression (1) and those by Cartesian coordinates is given in TABLE 1 below, up to n=2:

TABLE 1

| n | m | terms in Cartesian coordinates |
|---|---|---|
| 1 | 0 | Z |
| 1 | 1 | X or Y |
| 2 | 0 | $Z^2$ |
| 2 | 1 | ZX or ZY |
| 2 | 2 | $X^2 - Y^2$ or XY |

In the above TABLE 1, the integers n and m corresponds to those of equation (1) above.

On the other hand, the Z-component $B_{cz}$ of the main magnetic field generated by the coil 3 in the uniform field region 4 is expressed, up to the second order terms, as:

$$B_{cz} = B_0 + A_1 X + A_2 Y + A_3 ZX + A_4 ZY + A_5 XY + A_6 (X^2 - Y^2) \qquad (2)$$

where $B_0$ represents the magnetic field at the origin (0,0,0), and the term $A_1 X$, for example, represents the linear or first order error component along the X-axis.

According to an embodiment of this invention, the error terms up to the second order as expressed in equation (2) are compensated for and eliminated by means of the magnetic members 2, such that the magnetic field within the uniform field region 4 is rendered substantially uniform. Thus, the terms $A_1 X$, $A_2 Y$, $A_3 ZX$ etc., are to be compensated for by means of the magnetic field generated by the magnetic members 2. In the following, the arrangement (positions and dimensions) of the magnetic members 2 for compensating for the X-component error $A_1 X$ is described as an example.

As seen from equation (1), the number of magnetic field components generated by a magnetic shim 2 is infinite. However, since mounting radius a of the magnetic shim 2 is greater than r (a>r), the factor: $(r:a)^n$ appearing in equation (1) is negligibly small if n is sufficiently great. Thus, only the terms of equation (1) for small values of n and m are practically important. Here, only the radial components of $B_z$ (namely the terms for which $m \neq 0$) are considered. Thus, taken into consideration are the following terms $B^{nm}$ (n and m corresponding to those of the equation (1)): $B^{11}$, $B^{21}$, $B^{22}$, $B^{31}$, $B^{32}$, $B^{33}$, $B^{41}$, $B^{42}$, $B^{43}$, $B^{44}$, $B^{51}$, $B^{52}$, $B^{53}$, $B^{54}$.

As shown in TABLE 1 above, the $B^{11}$ component corresponds to X-component in Cartesian coordinates. Our object here is to compensate for the error term $A_1X$. Thus the above terms $B^{nm}$ must vanish except for $B^{11}$. To accomplish this, the positions and dimensions of the magnetic members 2 are determined in accordance with the principle of this invention as follows. First, as shown in FIG. 1, eight magnetic members 2 are arranged along the circumference such that the circumferential angles $\psi$ thereof with respect to the X-axis are at:

$$\psi = (\pi/2)(\pm(\tfrac{1}{2}) \pm (\tfrac{1}{3}) \pm (\tfrac{1}{4})), \tag{3}$$

such that, for m=2, 3, and 4, $$\Sigma \cos m(\phi - \psi) = 0$$

wherein the summation extends over the eight values of $\psi$ specified by equation (3) above.

Thus, the components $B^{nm}$ for which m=2, 3, 4, namely, $B^{22}$, $B^{32}$, $B^{33}$, $B^{42}$, $B^{43}$, $B^{44}$, $B^{52}$, $B^{53}$, $B^{54}$, vanish. Only the terms $B^{nm}$ where m=1: $B^{11}$, $B^{21}$, $B^{31}$, $B^{41}$, and $B^{51}$, remain, which are still to be vanished except for the first term $B^{11}$.

The terms $B^{21}$ and $B^{41}$ are vanished by selecting the end angles of the magnetic members 2 appropriately. Namely, if the sum of the outer angle $\alpha I$ and inner end angle $\alpha II$ of the magnetic shim 2 is equal to $\pi$:

$$\alpha I = \pi - \alpha II \tag{4}$$

then, $$B^{21} \propto [P_3^1(\cos\alpha)\sin^4\alpha]_{\pi - \alpha II}^{\alpha II}$$

$$B^{41} \propto [P_5^1(\cos\alpha)\sin^4\alpha]_{\pi - \alpha II}^{\alpha II}$$

Thus, $B^{21}$ and $B^{41}$ vanish.

Figure 5:
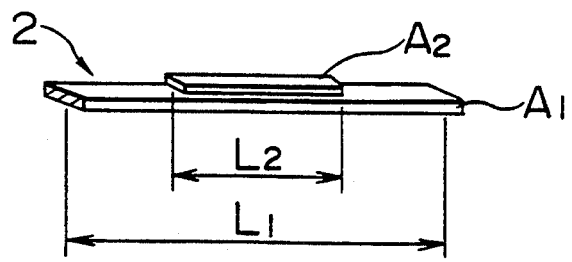
FIG. 5 is a perspective view of a magnetic shim consisting of two rod components.
Figure 9:
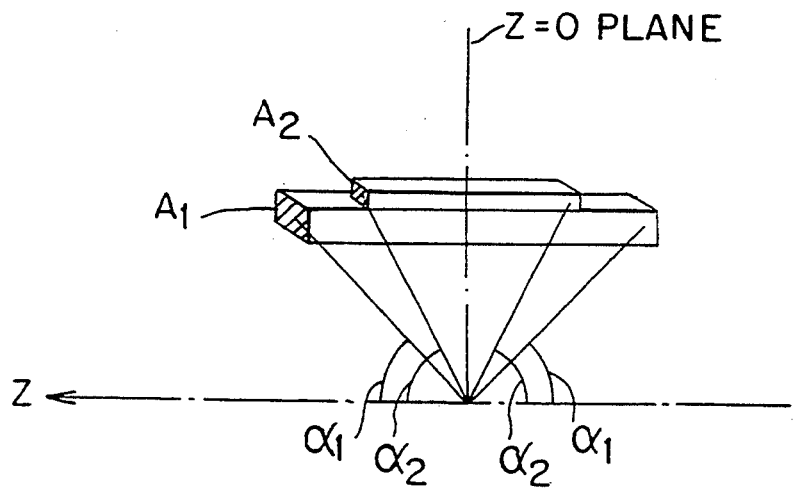
FIG. 9 illustrates a longitudinal sectional view of the magnetic components and respective inner and outer end angles.
Figure 10:
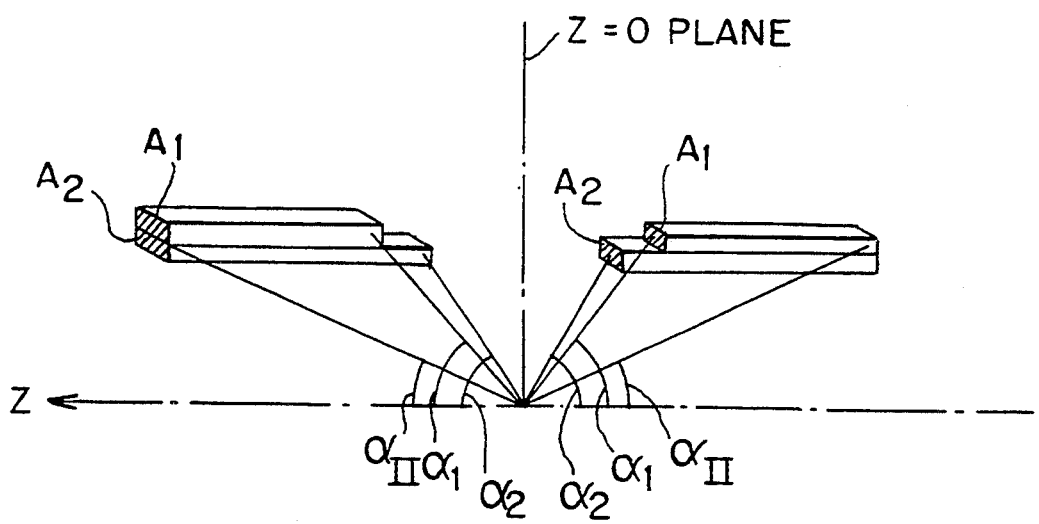
FIG. 10 illustrates a longitudinal sectional view of the magnetic components and respective inner and outer end angles.

Finally, the terms $B^{31}$ and $B^{51}$ are to be vanished. Thus, the magnetic members 2 are each composed of two rods as shown in FIG. 5, and the transverse sectional areas $A_1$ and $A_2$ thereof and the inner end angles $\alpha_1$ and $\alpha_2$ are selected to satisfy the relationships as specified below, the outer end angles being determined by the equation (4) above. The lengths $L_1$ and $L_2$ of the two rod-shaped components of the magnetic members 2 are determined by the inner and outer end angles and the mounting radius a of the magnetic members 2 (see FIGS. 4, 9 and 10).

The terms $B^{31}$ and $B^{51}$ for the magnetic shim 2 of FIG. 5 satisfy the following proportionalities:

$$B^{31} \propto A_1[P_4^1(\cos\alpha_1)\sin^5\alpha_1] + A_2[P_4^1(\cos\alpha_2)\sin^5\alpha_2] \tag{5}$$

$$B^{51} \propto A_1[P_6^1(\cos\alpha_1)\sin^7\alpha_1] + A_2[P_6^1(\cos\alpha_2)\sin^7\alpha_2] \tag{6}$$

Let a function $g(\alpha)$ of $\alpha$ to be defined by:

$$g(\alpha) = P_6^1(\cos\alpha)\sin^7\alpha / P_4^1(\cos\alpha)\sin^5\alpha = P_6^1(\cos\alpha) \sin^2\alpha / P_4^1(\cos\alpha) \tag{7}$$

Then, the proportionality equation (6) becomes:

$$B^{51} \propto A_1 g(\alpha_1)[P_4^1(\cos\alpha_1)\sin^5\alpha_1] + A_2 g(\alpha_2)[P_4^1(\cos\alpha_2)\sin^5\alpha_2] \tag{7a}$$

Figure 6:
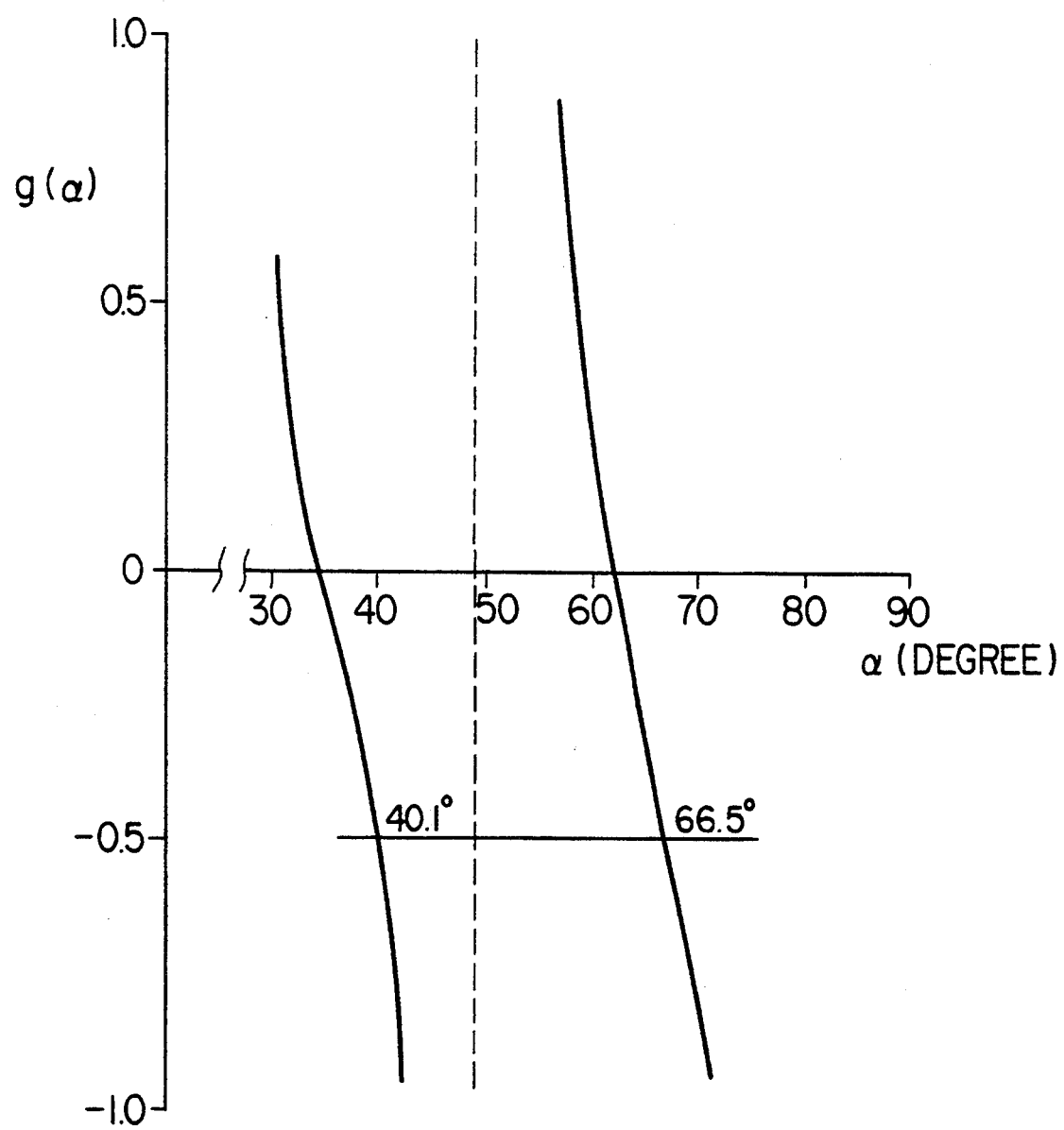
FIG. 6 is a diagram showing the values of a function $g(\alpha)$ with respect to end angle $\alpha$.

FIG. 6 shows the values of $g(\alpha)$ with respect to the angle $\alpha$. It is apparent from FIG. 6 that, for a given R, there exists $\alpha_1$ and $\alpha_2$ such that $$R = g(\alpha_1) = g(\alpha_2), \quad \alpha_1 \neq \alpha_2 \tag{8}$$

Substituting R of equation (8) into equation (7a), we obtain:

$$B^{51} \propto R\{A_1[P_4^1(\cos\alpha_1)\sin^5\alpha_1] + A_2[P_4^1(\cos\alpha_2)\sin^5\alpha_2]\} \tag{7b}$$

The expression within the brace { } of equation (7b) is identical to the right hand side of equation (5). As noted above, it is seen from FIG. 6 that if a certain value of R is selected, then two distinct angles $\alpha_1$ and $\alpha_2$ satisfying the above equation (8) for that value of R can be determined. For such a pair $\alpha_1$ and $\alpha_2$, the terms $B^{31}$ and $B^{51}$ are proportional to each other, since:

$$B^{31} \propto A_1[P_4^1(\cos\alpha_1)\sin^5\alpha_1] + A_2[P_4^1(\cos\alpha_2)\sin^5\alpha_2]$$

$$B^{51} \propto R\{A_1[P_4^1(\cos\alpha_1)\sin^5\alpha_1] + A_2[P_4^1(\cos\alpha_2)\sin^5A_2]\}$$

Thus, both terms $B^{31}$ and $B^{51}$ vanish if the transverse sectional areas $A_1$ and $A_2$ satisfy:

$$A_1[P_4^1(\cos\alpha_1)\sin^5\alpha_1] + A_2[P_4^1(\cos\alpha_2)\sin^5\alpha_2] = 0 \tag{9}$$

or $$A_2/A_1 = P_4^1(\cos\alpha_1)\sin^5\alpha_1 / P_4^1(\cos\alpha_2)\sin^5\alpha_2 \tag{9a}$$

The equation (9a) specifies the cross-sectional area ratio of the two rod components of each one of the magnetic members 2.

Next, a specific numeric example is given. It is assumed that the designer of the magnetic field correction device intends to limit the range for the end angles of the magnetic members 2 to within 140 degrees. If the value of $R = g(\alpha)$ is selected at $R = -0.5$ as shown in FIG. 6, the inner end angles of the respective rod components of a magnetic shim 2 satisfying the equation (8) above are: $\alpha_1 = 40.1°$ and $\alpha_2 = 66.5°$. Then, the outer end angles corresponding thereto are: $\pi - 40.1° = 139.9°$ and $\pi - 66.5° = 113.5°$, which are within 140° intended by the designer of the magnetic field correction device. Further, the cross-sectional area ratio of the two rod components as shown in FIG. 5 is determined by equation (9a) above as: $A_2/A_1 = 0.1336$, such that both terms $B^{31}$ and $B^{51}$ vanish. Since the value R can freely be selected, the freedom of design of the magnetic field correction device is ensured.

By arranging the magnetic members 2 at circumferential angles $\psi = (\pi/2)(\pm(\tfrac{1}{2}) \pm (\tfrac{1}{3}) \pm (\tfrac{1}{4}))$ with respect to the X-axis as shown in FIG. 1, negative linear (or first order) X-component ($A_1X < 0$) is generated. If the angles $\psi$ are each increased by $\pi$ such that $\psi \to \psi + \pi$, or $\psi = (\pi/2)(\pm(\tfrac{1}{2}) \pm (\tfrac{1}{3}) \pm (\tfrac{1}{4})) + \pi$, then, positive linear X-component ($A_1X > 0$) is generated.

Similarly, by arranging the magnetic members 2 at circumferential angles $\psi=(\pi/2)(\pm(\frac{1}{2})\pm(\frac{1}{3})\pm(\frac{1}{4}))+\pi/2$ with respect to the X-axis, negative linear Y-component ($A_2Y<0$) is generated. Further, if the angles $\psi$ are each increased by $\pi$ such that $\psi=(\pi/2)(\pm(\frac{1}{2})\pm(\frac{1}{3})\pm(\frac{1}{4})+3\pi/2$, positive linear Y-component ($A_2Y>0$) is generated. Thus, the linear or first order error terms in equation (2) of either polarity can be compensated for and eliminated.

As shown in TABLE 1, the second order error terms $A_3ZX$ and $A_4ZY$ in equation (2) correspond to the output term $B^{21}$ of the magnetic members 2, while those $A_5XY$ and $A_6(X^2-Y^2)$ correspond to $B^{22}$. Thus, by an argument similar to the above, it is shown that the second order error components can be compensated for and eliminated by arranging the magnetic members 2 each of which consists of two rod components (of transverse sectional area $A_1$ and $A_2$, end angles $\alpha$, and circumferential angles $\psi$ with respect to the X-axis), such that the transverse sectional area ratio $A_1/A_2$, the end angles, and the circumferential angles $\psi$ satisfy specific relationships.

More specifically, for the purpose of eliminating first order error terms with respect to X and Y: (1) the non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ to accommodate respective magnetic members thereat; (2) when said magnetic members are inserted into respective non-magnetic tubes, a sum of two end angles of each of the two rod-shaped components of said magnetic members with respect to an origin at a center of a uniform field region are equal to $\pi$; and (3) when said magnetic members are inserted into respective non-magnetic tubes, transverse cross sectional areas $A_1$ and $A_2$ and inner end angles $\alpha_1$ and $\alpha_2$, with respect to said origin, of the two rod-shaped components of said magnetic members satisfy:

$$(A_2/A_1) = -P^1{}_4(\cos\alpha_1)\sin^5\alpha_1 / P^1{}_4(\cos\alpha_2)\sin^5\alpha_2,$$

wherein: $P^1{}_4$ is an associated Legendre polynomial; and $\alpha_1$ and $\alpha_2$ are two distinct angles such that $g(\alpha_1)=g(\alpha_2)$, where $g(\alpha)=P^1{}_6(\cos\alpha)\sin^2\alpha/P^1{}_4(\cos\alpha)$, $P^1{}_6$ and $P^1{}_4$ being associated Legendre polynomials.

For the purpose of eliminating the second order terms with respect to Zx and Zy; (1) the non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ to accommodate respective magnetic embers 2 thereat; (2) when said magnetic members are inserted into respective non-magnetic tubes, outer end angles $\alpha$II of the two rod-shaped components of the magnetic members with respect to an origin at a center of a uniform field region are equal to each other; and (3) when said magnetic members are inserted into respective non-magnetic tubes, transverse cross sectional areas $A_1$ and $A_2$ and inner end angles $\alpha_1$ and $\alpha_2$ with respect to said origin, of the two rod-shaped components of said magnetic members satisfy:

$$(A_2/A_1) = -P^1{}_5(\cos\alpha_1)\sin^6\alpha_1 / P^1{}_5(\cos\alpha_2)\sin^6\alpha_2,$$

wherein: $P^1{}_5$ is an associated Legendre polynomial; and $\alpha_1$ and $\alpha_2$ are two distinct angles such that $g(\alpha_1)=-g(\alpha_2)=g(\alpha\text{II})$, where $g(\alpha)=P^1{}_7(\cos\alpha)\sin^2\alpha/P^1{}_5(\cos\alpha)$, $P^1{}_7$ and $P^1{}_5$ being associated Legendre polynomials.

For the purpose of eliminating the second order errors with respect to XY and $X^2$-$Y^2$: (1) the non-magnetic tubes are disposed at circumferential angles $(\pi/2)(\pm 1/1 \pm\frac{1}{3}\pm\frac{1}{4})+(\frac{1}{4})\pi$, $(\pi/2)(\pm 1/1 \pm\frac{1}{3}\pm\frac{1}{4})+(\frac{3}{4})\pi$, $(\pi/2)(\pm 1/1 \pm\frac{1}{3}\pm\frac{1}{4})$, or $(\pi/2)(\pm 1/1 \pm\frac{1}{3}\pm\frac{1}{4})+(\frac{1}{2})\pi$ to accommodate respective magnetic members thereat; (2) when said magnetic members are inserted into respective non-magnetic tubes, a sum of two end angles of each of the two rod-shaped components of said magnetic members with respect to an origin at a center of a uniform field region are equal to $\pi$; and (3) when said magnetic members are inserted into respective non-magnetic tubes, transverse cross sectional areas $A_1$ and $A_2$ and inner end angles $\alpha_1$ and $\alpha_2$, with respect to said origin, of the two rod-shaped components of said magnetic members satisfy:

$$(A_2/A_1) = -P^2{}_5(\cos\alpha_1)\sin^6\alpha_1 / P^2{}_5(\cos\alpha^2)\sin^6\alpha_2,$$

wherein: $P^1{}_4$ is an associated Legendre polynomial; and $\alpha_1$ and $\alpha_2$ are two distinct angles such that $g(\alpha_1)=g(\alpha_2)$, where $g(\alpha)=P^2{}_7(\cos\alpha)\sin^2\alpha/P^2{}_5(\cos\alpha)$, $P^2{}_7$ and $P^2{}_5$ being associated Legendre polynomials.

TABLE 2 below shows an example of the numeric values of the arrangement of the magnetic members 2:

TABLE 2

| Component | sectional area ratio $\left(\dfrac{A_2}{A_1}\right)$ | end angles $\alpha$ (inner) (outer) | circumferential angles x (rad) | | |
|---|---|---|---|---|---|
| Y | 0.1336 | 40.1°, 139.9° ($A_1$)<br>66.5°, 113.5° ($A_2$) | $\dfrac{\pi}{2}\left(\pm\dfrac{1}{2}\pm\dfrac{1}{3}\pm\dfrac{1}{4}\right)+\dfrac{\pi}{2}$, $\dfrac{\pi}{2}\left(\pm\dfrac{1}{2}\pm\dfrac{1}{3}\pm\dfrac{1}{4}\right)+\dfrac{3}{2}\pi$ | | |
| ZX | 0.673 | 36.06°, 61.42° ($A_1$)<br>36.06°, 82.34° ($A_2$) | $\dfrac{\pi}{2}\left(\pm\dfrac{1}{2}\pm\dfrac{1}{3}\pm\dfrac{1}{4}\right)$ | $\dfrac{\pi}{2}\left(\pm\dfrac{1}{2}\pm\dfrac{1}{3}\pm\dfrac{1}{4}\right)+\pi$ | |
|  |  | 118.58°, 143.94° ($A_1$)<br>97.66°, 143.94° ($A_2$) | $\dfrac{\pi}{2}\left(\pm\dfrac{1}{2}\pm\dfrac{1}{3}\pm\dfrac{1}{4}\right)+\pi$ | $\dfrac{\pi}{2}\left(\pm\dfrac{1}{2}\pm\dfrac{1}{3}\pm\dfrac{1}{4}\right)$ | |
| ZY | 0.673 | 36.06°, 61.42° ($A_1$)<br>36.06°, 82.34° ($A_2$) | $\dfrac{\pi}{2}\left(\pm\dfrac{1}{2}\pm\dfrac{1}{3}\pm\dfrac{1}{4}\right)+\dfrac{\pi}{2}$ | $\dfrac{\pi}{2}\left(\pm\dfrac{1}{2}\pm\dfrac{1}{3}\pm\dfrac{1}{4}\right)+\dfrac{\pi}{2}$ | |
|  |  | 118.58°, 143.94° ($A_1$)<br>97.66°, 143.94° ($A_2$) | $\dfrac{\pi}{2}\left(\pm\dfrac{1}{2}\pm\dfrac{1}{3}\pm\dfrac{1}{4}\right)+\dfrac{3}{2}\pi$ | $\dfrac{\pi}{2}\left(\pm\dfrac{1}{2}\pm\dfrac{1}{3}\pm\dfrac{1}{4}\right)+\dfrac{3}{2}\pi$ | |

TABLE 2-continued

| Component | sectional area ratio $\left(\frac{A_2}{A_1}\right)$ | end angles α (inner) (outer) | circumferential angles x (rad) |
|---|---|---|---|
| XY | 0.1694 | 45.71°, 134.29° (A$_1$) 69.55°, 110.45° (A$_2$) | $\frac{\pi}{2}\left(\pm\frac{1}{1}\pm\frac{1}{3}\pm\frac{1}{4}\right)+\frac{\pi}{4}, \frac{\pi}{2}\left(\pm\frac{1}{1}\pm\frac{1}{3}\pm\frac{1}{4}\right)+\frac{3}{4}\pi$ |
| X$^2$ − Y$^2$ | 0.1694 | 45.71°, 134.29° (A$_1$) 69.55°, 110.45° (A$_2$) | $\frac{\pi}{2}\left(\pm\frac{1}{1}\pm\frac{1}{3}\pm\frac{1}{4}\right), \frac{\pi}{2}\left(\pm\frac{1}{1}\pm\frac{1}{3}\pm\frac{1}{4}\right)+\frac{\pi}{2}$ |

In TABLE 2, alternative values of the pairs of the end angles for the components ZX and ZY are given.

Thus, by making each one of the magnetic members 2 out of two rod components and setting to predetermined values: (1) the transverse sectional area ratio $A_1/A_2$ of the two rod components of each one of the magnetic members 2; (2) the end angles α of the two rod components of each one of the magnetic members 2; and (3) the circumferential attachment angles ψ of the magnetic members 2, all the error terms up to second order in equation (2) can be compensated for and eliminated by means of the magnetic field generated by magnetic members 2. Thus, according to this invention, the non-magnetic tubes 1 are disposed at predetermined locations with respect to the coil 3, such that the magnetic members 2 are selectively inserted thereinto to compensate for and eliminate the error terms in equation (2).

Figure 7:
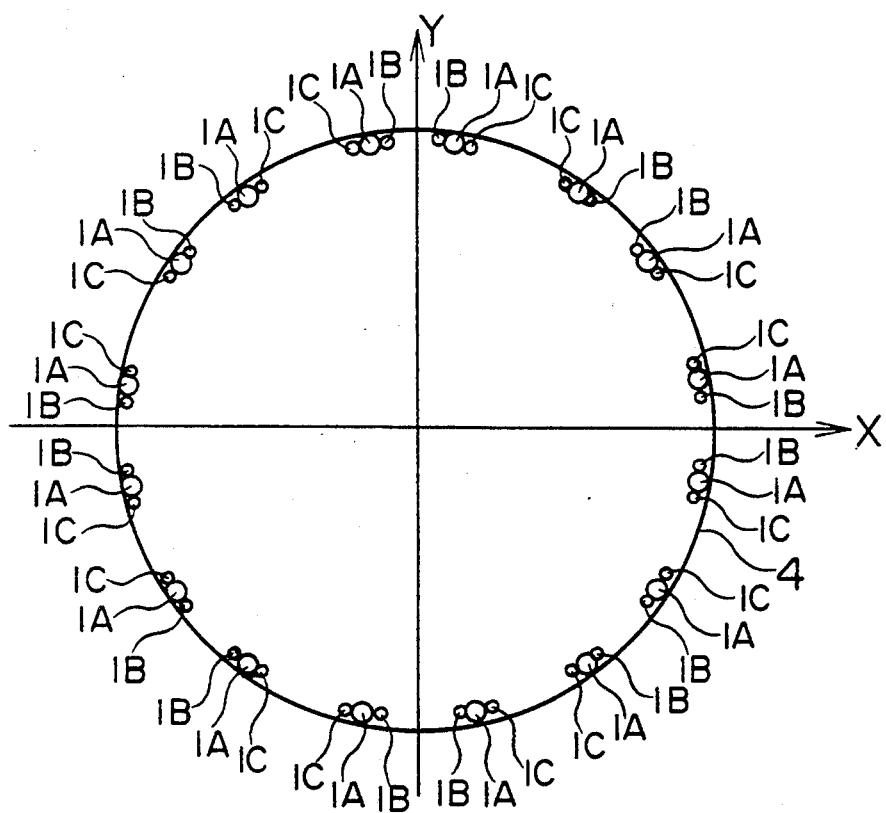
FIG. 7 is a diagram showing an example of circumferential angular positions of the non-magnetic tubes for accommodating magnetic shims (magnetic members)
Figure 8:
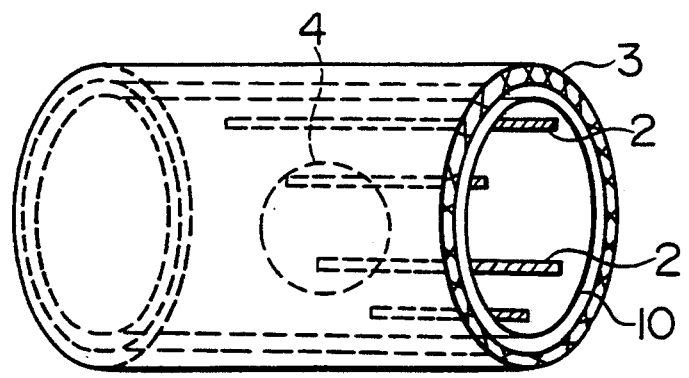
FIG. 8 is a schematic perspective view of a conventional magnetic field correction device.

FIG. 7 is a diagram showing an example of circumferential angular positions of the non-magnetic tubes for accommodating magnetic shims (magnetic members), wherein: reference numerals 1A designate the non-magnetic tubes for compensating for the X and Y components; 1B, the non-magnetic tubes for the ZX and ZY components; and 1C, the non-magnetic tubes for the XY and X$^2$-Y$^2$ components. The non-magnetic tubes 1 have lengths corresponding to the lengths of the magnetic members 2 that are to be inserted thereinto.

As can be seen from equation (1) above, the absolute output value of the correction terms B$^{nm}$ (for example, B$^{11}$ for A$_1$X) can be adjusted by selecting the overall transverse sectional area of the magnetic members 2 while maintaining the area ratio A$_2$/A$_1$ of the two rod components at the specific predetermined value. Thus, a number of magnetic members 2 having different overall transverse sectional areas (the lengths are determined by the end angles and the mounting radius a as specified above and the cross sectional area ratios are determined as described above) are provided, and those which balance and compensate for the error terms are selected and inserted into the non-magnetic tubes 1. The non-magnetic tubes 1 thus have inner diameters sufficient to accommodate the magnetic members 2 of largest cross-sectional area that are provided to be inserted therein.

What is claimed is:

1. A magnetic field correction device for generating a uniform field within a hollow cylinder-shaped coil, comprising:

a plurality of non-magnetic tubes disposed on an internal surface of a cylinder of a predetermined radius disposed coaxially within said coil, each of said non-magnetic tubes extending along an axial direction of said coil and disposed at predetermined angles around a circumference of said cylinder; and a plurality of magnetic members removably inserted into said plurality of non-magnetic tubes, each of said magnetic members comprising two components arranged in overlapping relation and having predetermined lengths and predetermined transverse sectional area ratio, such that each of said components forms a predetermined inner end angle and a predetermined outer end angle when inserted into respective non-magnetic tubes, wherein said non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ of said cylinder to accommodate respective magnetic members; and wherein said magnetic members are inserted into respective non-magnetic tubes such that a sum of said predetermined inner end angle and said predetermined outer angle of each of the two components of said magnetic members with respect to an origin at a center of a uniform field region are equal to π; and wherein said magnetic members are inserted into respective non-magnetic tubes such that transverse cross sectional area A$_1$ and A$_2$ and inner end angles α$_1$ and α$_2$, with respect to said origin, of the two components of said magnetic members satisfy:

(A$_2$/A$_1$) = −P$^1_4$(cosα1)sin$^5$α1/P$^1_4$(cosα2)sin$^5$α2, wherein: P$^1_4$ is an associated Legendre polynomial; and α1 and α2 are two distinct angles such that g(α1)=g(α2), where g(α)=P$^1_6$ (cosα)sin$^2$ α/P$^1_4$ (cosα), P$^1_6$ and P$^1_4$ being associated Legendre polynomials.

2. A magnetic field correction device for generating a uniform field within a hollow cylinder-shaped coil, comprising:

a plurality of non-magnetic tubes disposed on an internal surface of a cylinder of a predetermined radius disposed coaxially within said coil, each of said non-magnetic tubes extending along an axial direction of said coil and disposed at predetermined angles around a circumference of said cylinder; and a plurality of magnetic members removably inserted into said plurality of non-magnetic tubes, each of said magnetic members comprising two components arranged in overlapping relation and having predetermined lengths and predetermined transverse sectional area ratio, such that each of said components forms a predetermined inner end angle and a predetermined outer end angle when inserted into respective non-magnetic tubes, wherein said non-magnetic tubes are disposed at circumferential angles $(\pi/2)(\pm\frac{1}{2}\pm\frac{1}{3}\pm\frac{1}{4})$, $(\pi/2)(\pm\frac{1}{2}\pm\frac{1}{3}\pm\frac{1}{4})+\pi$, $(\pi/2)(\pm\frac{1}{2}\pm\frac{1}{3}\pm\frac{1}{4})+(\frac{1}{2})\pi$, or $(\pi/2)(\pm\frac{1}{2}\pm\frac{1}{3}\pm\frac{1}{4})+(3/2)\pi$ of said cylinder to accommodate respective magnetic members; and wherein said magnetic members are inserted into respective non-magnetic tubes, outer end angles $\alpha I$ of the two components of said magnetic members with respect to an origin at a center of a uniform field region are equal to each other; and wherein said magnetic members are inserted into respective non-magnetic tubes such that transverse cross sectional areas $A_1$ and $A_2$ and inner end angles $\alpha 1$ and $\alpha 2$, with respect to said origin, of the two components of said magnetic members satisfy:

$(A_2/A_1) = -P^1{}_5(\cos\alpha 1)\sin^6\alpha 1/P^1{}_5(\cos\alpha 2)\sin^6\alpha 2$, wherein: $P^1{}_5$ is an associated Legendre polynomial; and $\alpha 1$ and $\alpha 2$ are two distinct angles such that $g(\alpha 1) = g(\alpha 2) = g(\alpha II)$, where $g(\alpha) = P^1{}_7(\cos\alpha)\sin^2\alpha/P^1{}_5(\cos\alpha)$, $P^1{}_7$ and $P^1{}_5$ being associated Legendre polynomials.

3. A magnetic field correction device for generating a uniform field within a hollow cylinder-shaped coil, comprising:

a plurality of non-magnetic tubes disposed on an internal surface of a cylinder of a predetermined radius disposed coaxially within said coil, each of said non-magnetic tubes extending along an axial direction of said coil and disposed at predetermined angles around a circumference of said cylinder; and a plurality of magnetic members removably inserted into said plurality of non-magnetic tubes, each of said magnetic members comprising two components arranged in overlapping relation and having predetermined lengths and predetermined transverse sectional area ratio, such that each of said components forms a predetermined inner end angle and a predetermined outer end angle when inserted into respective non-magnetic tubes, wherein said non-magnetic tubes are disposed at circumferential angles $(\pi/2)(\pm 1/1 \pm \frac{1}{3} \pm \frac{1}{4})+(\frac{1}{2})\pi$, $(\pi/2)(\pm 1/1 \pm \frac{1}{3} \pm \frac{1}{4})+(\frac{3}{2})\pi$, $(\pi/2)(\pm 1/1 \pm \frac{1}{3} \pm \frac{1}{4})$, or $(\pi/2)(\pm 1/1 \pm \frac{1}{3} \pm \frac{1}{4})+(\frac{1}{2})\pi$ of said cylinder to accommodate respective magnetic members; and wherein said magnetic members are inserted into respective non-magnetic tubes, a sum of said predetermined inner end angle and said predetermined outer of each of the two components of said magnetic members with respect to an origin at a center of a uniform field region are equal to $\pi$; and wherein said magnetic members are inserted into respective non-magnetic tubes such that transverse cross sectional areas $A_1$ and $A_2$ and inner end angles $\alpha 1$ and $\alpha 2$, with respect to said origin, of the two rod-shaped components of said magnetic members satisfy:

$(A_2/A_1) = -P^2{}_5(\cos\alpha 1)\sin^6\alpha 1/P^2{}_5(\cos\alpha 2)\sin^6\alpha 2$, wherein: $P^2{}_5$ is an associated Legendre polynomial; and $\alpha 1$ and $\alpha 2$ are two distinct angles such that $g(\alpha 1) = g(\alpha 2)$, where $g(\alpha) = P^2{}_7(\cos\alpha)\sin^2\alpha/P^2{}_5(\cos\alpha)$, $P^2{}_7$ and $P^2{}_5$ being associated Legendre polynomials.

* * * * *